(12) United States Patent　　(10) Patent No.: US 8,981,517 B2
Oshiyama et al.　　(45) Date of Patent: Mar. 17, 2015

(54) SOLID-STATE IMAGE PICKUP DEVICE AND IMAGE PICKUP APPARATUS INCLUDING THE SAME

(71) Applicant: Sony Corporation, Tokyo (JP)

(72) Inventors: Itaru Oshiyama, Kumamoto (JP); Susumu Hiyama, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/793,837

(22) Filed: Mar. 11, 2013

(65) Prior Publication Data

US 2013/0200252 A1　　Aug. 8, 2013

Related U.S. Application Data

(63) Continuation of application No. 12/736,569, filed as application No. PCT/JP2010/053729 on Mar. 2, 2010, now Pat. No. 8,405,016.

(30) Foreign Application Priority Data

Mar. 12, 2009　(JP) .................................. 2009-059961
Feb. 8, 2010　(JP) .................................. 2010-025669

(51) Int. Cl.
　　*H01L 31/06*　　(2012.01)
　　*H01L 31/00*　　(2006.01)
　　(Continued)

(52) U.S. Cl.
　　CPC ........ *H01L 27/148* (2013.01); *H01L 27/14632* (2013.01); *H01L 27/14687* (2013.01);
　　(Continued)

(58) Field of Classification Search
　　CPC ................. H01L 27/14643; H01L 27/14649; H01L 27/14658; H01L 27/148; H01L 27/146; H01L 27/14638; H01L 27/14663; H01L 27/14645; H01L 27/14627; H01L 27/14621; H01L 27/14647; H01L 31/14; H01L 31/101; H01L 31/02162
　　USPC .......... 257/292, 440, 461, E31.058, E31.063, 257/E31.096, E31.115, E33.076, E33.077
　　See application file for complete search history.

(56) References Cited

U.S. PATENT DOCUMENTS 7,531,857 B2 * 　5/2009　Park ............................... 257/291
7,531,860 B2 * 　5/2009　Kim ............................... 257/292
(Continued)

FOREIGN PATENT DOCUMENTS

CN　　101079967 A　　11/2007
JP　　2005-123280　　5/2005
(Continued)

OTHER PUBLICATIONS

International Search Report; International Application No. PCT/JP2010/053729; Dated: May 24, 2010.
(Continued)

*Primary Examiner* — Ida M Soward
(74) *Attorney, Agent, or Firm* — Rader, Fishman & Grauer PLLC

(57) ABSTRACT

A solid-state image pickup element 1 is structured so as to include: a semiconductor layer 2 having a photodiode formed therein, photoelectric conversion being carried out in the photodiode; a first film 21 having negative fixed charges and formed on the semiconductor layer 2 in a region in which at least the photodiode is formed; and a second film 22 having the negative fixed charges, made of a material different from that of the first film 21 having the negative fixed charges, and formed on the first film 21 having the negative fixed charges.

15 Claims, 15 Drawing Sheets

(51) Int. Cl.
*H01L 31/062* (2012.01)
*H01L 31/113* (2006.01)
*H01L 27/148* (2006.01)
*H01L 27/146* (2006.01)

(52) U.S. Cl.
CPC ..... *H01L27/14621* (2013.01); *H01L 27/14623* (2013.01); *H01L 27/14627* (2013.01); *H01L 27/14645* (2013.01); *H01L 27/14685* (2013.01)
USPC .... 257/481; 257/292; 257/440; 257/E31.058; 257/E31.063; 257/E31.096; 257/E31.115; 257/E33.076; 257/E33.077

(56) References Cited

U.S. PATENT DOCUMENTS

| | | | |
|---|---|---|---|
| 7,535,073 B2 * | 5/2009 | Ezaki | 257/440 |
| 7,547,927 B2 * | 6/2009 | Suzuki et al. | 257/184 |
| 7,642,117 B2 * | 1/2010 | Woo | 438/69 |
| 7,888,763 B2 * | 2/2011 | Qian et al. | 257/460 |
| 7,928,352 B2 * | 4/2011 | Toda | 250/208.1 |
| 7,968,923 B2 * | 6/2011 | Nagaraja et al. | 257/294 |
| 8,154,097 B2 * | 4/2012 | Kim et al. | 257/432 |
| 8,183,603 B2 * | 5/2012 | Yamaguchi et al. | 257/223 |
| 8,222,710 B2 * | 7/2012 | Hung et al. | 257/443 |
| 8,664,031 B2 * | 3/2014 | Fujisawa | 438/72 |
| 2003/0122209 A1 * | 7/2003 | Uya | 257/435 |
| 2007/0034981 A1 * | 2/2007 | Saito | 257/462 |
| 2007/0210395 A1 * | 9/2007 | Maruyama et al. | 257/431 |
| 2008/0283728 A1 * | 11/2008 | Inoue | 250/208.1 |
| 2009/0057659 A1 * | 3/2009 | Maehara et al. | 257/40 |
| 2009/0090988 A1 * | 4/2009 | Ohgishi | 257/432 |
| 2009/0096049 A1 | 4/2009 | Oshiyama et al. | |
| 2009/0189235 A1 | 7/2009 | Ikeda et al. | |
| 2009/0189237 A1 | 7/2009 | Hirano | |
| 2009/0200623 A1 * | 8/2009 | Qian et al. | 257/432 |
| 2011/0223707 A1 * | 9/2011 | Hynecek et al. | 438/70 |
| 2011/0237014 A1 * | 9/2011 | Hiyama et al. | 438/60 |
| 2013/0063636 A1 * | 3/2013 | Ohgishi | 348/294 |

FOREIGN PATENT DOCUMENTS

| | | |
|---|---|---|
| JP | 2007-088305 | 4/2007 |
| JP | 2008-306154 A | 12/2008 |
| JP | 2009-176951 | 8/2009 |
| JP | 2009-176952 | 8/2009 |

OTHER PUBLICATIONS

Chinese Office Action issued Nov. 26, 2013 for corresponding Chinese Application No. 2010800015469.
Office Action issued in Chinese Application No. 2010800015469, dated May 26, 2014.

* cited by examiner

SOLID-STATE IMAGE PICKUP DEVICE AND IMAGE PICKUP APPARATUS INCLUDING THE SAME

CROSS REFERENCES TO RELATED APPLICATIONS

This is a Continuation Application of U.S. patent application Ser. No. 12/736,569, filed Oct. 20, 2010, which is based on a National Stage Application of PCT/JP2010/053729, filed Mar. 2, 2010, which in turn claims priority from Japanese Patent Application JP 2009-059961 filed with the Japanese Patent Office on Mar. 12, 2009 and Japanese Patent Application JP 2010-025669 filed with the Japanese Patent Office on Feb. 8, 2010, the entire contents of which being incorporated herein by reference.

TECHNICAL FIELD

The present invention relates to a solid-state image pickup element, a method of manufacturing the same, and an image pickup apparatus including the same.

BACKGROUND ART

It is known that in a charge coupled device (CCD) solid-state image pickup element and a complementary metal oxide semiconductor (CMOS) solid-state image pickup element, crystal defects in a photodiode, and interface states in an interface between a light receiving portion formed on a silicon substrate, and an insulating layer formed on the light receiving portion cause a dark current.

FIG. 12A is a schematic cross sectional view explaining the case where an insulating layer is formed on a silicon layer having a photodiode formed therein. FIG. 12B is an energy diagram of the structure shown in FIG. 12A. As shown in FIGS. 12A and 12B, interface states each indicated by a mark x occur in an interface between a silicon layer 51 having a photodiode PD formed therein, and an insulating layer 52 formed on the silicon layer 51. These interface states become a generation source of a dark current, and electrons originating in the interface are caused to flow in the form of the dark current into the photodiode PD.

In order to cope with this situation, a so-called hole accumulation diode (HAD) structure is adopted as a technique for controlling the generation of the dark current. (This technique, for example, is described in Patent Document 1.)

FIG. 13A is a schematic cross sectional view explaining the case where an HAD structure is obtained by forming a p$^+$-type semiconductor region. FIG. 13B is an energy diagram of the HAD structure shown in FIG. 13A. Specifically, as shown in FIGS. 13A and 13B, a p-type impurity is introduced into the neighborhood of a surface of a silicon layer 51 to form a p$^+$-type semiconductor region, and the resulting p$^+$-type semiconductor region is made a positive charge accumulation region 53 for accumulating therein positive charges (holes).

The HAD structure is obtained in which the positive charge accumulation region 53 is formed in the interface of the silicon layer 51 in such a manner, whereby the photodiode PD is kept away from the interface, thereby making it possible to suppress the generation of the dark current with the interface states as the generation source.

In general, in forming the HAD structure, ions such as B ions or BF$_2$ ions are implanted into the silicon layer 51 at an anneal temperature, thereby forming the p$^+$-type semiconductor region becoming the positive charge accumulation region 53 in the neighborhood of the interface of the silicon layer 51.

Also, it is essential for an existing ion implantation process that for the purpose of realizing the proper diffusion and activation of the ions implanted, a high temperature is held for as long a time period as possible.

However, holding the high temperature for a long time period is not desirable from a viewpoint of sufficiently ensuring the characteristics or the like of the solid-state image pickup element.

As shown in FIGS. 14A and 14B, there is proposed a technique for forming an insulating layer 55 having negative fixed charges 54 on the silicon layer 51 having the photodiode PD formed therein instead of forming a normal insulating layer 52. (This technique, for example, is described in Patent Document 2.)

According to this technique, even when as shown in FIG. 14B, the ions are not implanted into the silicon layer 51 in a state in which a band is bent, the positive charge accumulation region 53 is formed in the neighborhood of the interface of the silicon layer 51, thereby making it possible to accumulate the positive charges (holes) in the positive charge accumulation region 53.

For example, $HfO_2$, $ZrO_2$, $Al_2O_3$, $TiO_2$, $Ta_2O_5$ or the like, is given as a material for the insulating layer 55 having such negative fixed charges 54.

PRIOR ART DOCUMENT

Patent Documents

Patent Document 1: Japanese Patent Laid-Open No. 2005-123280
Patent Document 2: Japanese Patent Laid-Open No. 2008-306154

DISCLOSURE OF INVENTION

Technical Problem

The technique described in Patent Document 2 is proposed that in depositing the insulating layer having the negative fixed charges, a first film deposited by utilizing either an atomic layer deposition (ALD) method or a metal organic chemical vapor deposition (MOCVD) method, and a second film deposited by utilizing a physical vapor deposition (PVD) method are laminated in order.

According to that technique, the generation of the interface states can be suppressed by utilizing the ALD method, and the productivity can be enhanced by utilizing the PVD method.

With the manufacturing method proposed in Patent Document 2, however, since the same oxides are laminated and formed by utilizing the different two kinds of depositing methods, the characteristics of the insulating layer 55 having the negative fixed charges 54 are restricted by the oxide used.

The present invention has been made in order to solve the problems described above, and it is therefore desirable to provide a solid-state image pickup element in which generation of a dark current can be suppressed, and a restriction of characteristics of a layer having negative fixed charges can be relaxed, a method of manufacturing the same, and an image pickup apparatus including the same.

Technical Solution

In order to attain the desire described above, according to the present invention, there is provided a solid-state image pickup element including: a semiconductor layer having a photodiode formed therein, photoelectric conversion being carried out in the photodiode; a first film having negative fixed charges formed on the semiconductor layer in a region having at least the photodiode formed therein. In addition, the solid-state image pickup element includes a second film having the negative fixed charge, made of a material different from that of the first film having the negative fixed charges, and formed on the first film having the negative fixed charges.

According to the present invention, there is provided a method of manufacturing a solid-state image pickup element including: a process for forming a photodiode in a semiconductor layer; a process for forming a first film having negative fixed charges on the semiconductor layer in a region having at least the photodiode formed therein. In addition, the method includes a process for forming a second film having negative fixed charges, made of a material different from that of the first film having the negative fixed charges on the first film having the negative fixed charges.

According to the present invention, there is provided an image pickup apparatus including: a condensing optical portion configured to condense an incident light; a solid-state image pickup element serving to receive the incident light condensed by the condensing optical portion, thereby carrying out photoelectric conversion for the incident light; and a signal processing portion configured to process a signal obtained through the photoelectric conversion in the solid-state image pickup element. Further, the image pickup apparatus according to the present invention, the solid-state image pickup element is configured as the solid-state image pickup element of the invention.

With the structure of the solid-state image pickup element according to the present invention, the formation of the first film and the second film each having the negative fixed charges results in that a positive charge accumulation region is formed in the neighborhood of an interface (the neighborhood of a surface) of the semiconductor layer having the photodiode formed therein, thereby making it possible to accumulate the positive charges (holes) in the positive charge accumulation region. As a result, it is possible to suppress the generation of the dark current caused by the interface states. In addition, the sufficient negative bias effect is obtained by combining the first film and the second film with each other.

In addition, by the first film having the negative fixed charges, the semiconductor layer can be prevented from being damaged when the second film having the negative fixed charges is formed.

Moreover, since the second film is made of the material different from that of the first film, as shown in the Patent Document 2 described above, it is unnecessary to laminate the same material by the two film deposition methods. Thus, the restriction to the material of the film having the negative fixed charges is relaxed.

With the constitution of the method of manufacturing a solid-state image pickup element according to the present invention, the first film having the negative fixed charges can be formed on the semiconductor layer in the region having at least photodiode formed therein. In addition, since a second film having the negative fixed charge is formed on the first film having the negative fixed charges, by these tow layers, the structure can be obtained such that the positive charges (holes) can be accumulated in the neighborhood of the interface (in the neighborhood of the surface) of the semiconductor layer having the photodiode formed therein. As a result, it is possible to suppress the generation of the dark current caused by the interface states.

Also, since the first film is formed as the base of the second film, the first film can prevent the semiconductor layer from being damaged in forming the second film.

Since the second film is made of the material different from that of the first film, unlike the case of the technique described in Patent Document 2, the same oxide materials do not have to be laminated by utilizing the different two film depositing methods, and thus the restriction of the material for the film having the negative fixed charges is relaxed.

With the configuration of the image pickup apparatus according to the present invention, since the solid-state image pickup element of the embodiment composes the image pickup apparatus of the invention, it is possible to suppress the generation of the dark current.

Advantageous Effects

As set forth hereinabove, according to the image pickup element and the method of manufacturing the same of the present invention, it is possible to suppress the generation of the dark current caused by the interface states in accordance with the effect of the negative bias having the sufficient magnitude.

Therefore, it is possible to realize the solid-state image pickup element which has the high reliability, and which operates stably without generating the dark current.

In addition, the restriction of the material for the film having the negative fixed charges is relaxed. Thus, the restriction of the characteristics of the film having the negative fixed charges is also relaxed. As a result, it is possible to increase the degree of freedom of the design of the solid-state image pickup element.

According to the image pickup apparatus of the present invention, since the generation of the dark current can be suppressed in the solid-state image pickup element, the signal obtained through the photoelectric conversion in the solid-state image pickup element is stabilized.

Therefore, it is possible to realize the highly reliable image pickup apparatus which stably operates and in which the satisfactory image quality is obtained.

MODE FOR CARRYING OUT THE INVENTION

Figure 1:
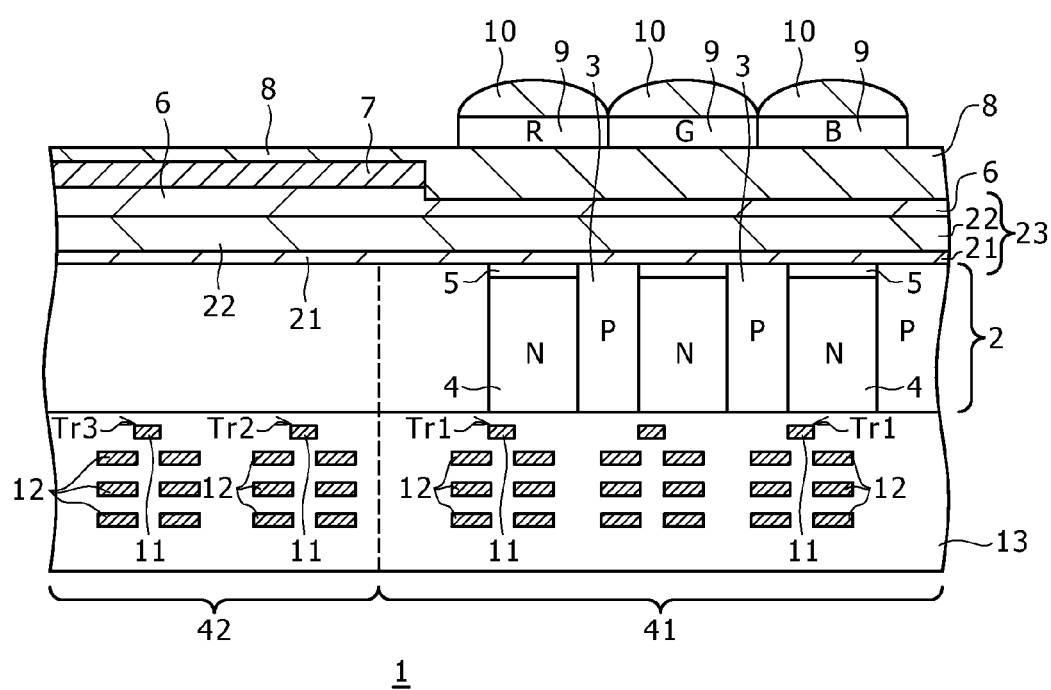
FIG. 1 is a schematic cross sectional view showing a structure of a solid-state image pickup element according to an embodiment of the present invention.

The preferred embodiments of the present invention will be described in detail hereinafter with reference to the accompanying drawings.

It is noted that the description will now be given in accordance with the following order.
  1. Outline of the Invention
  2. Solid-State Image Pickup Element
  3. Experiments (Measurements about Characteristics)
  4. Image Pickup Apparatus <1. Outline of the Invention>

In the present invention, a first film having negative fixed charges is formed on a semiconductor layer in a region in which at least a photodiode of a solid-state image pickup element is formed, and a second film having the negative fixed charges is formed on the first film having the negative fixed charges.

The second film having the negative fixed charges is made (deposited) of a material different from that of the first film having the negative fixed charges.

The materials of the first film having the negative fixed charges and the second film having the negative fixed charges can be each formed from insulating films containing therein at least one element of silicon, hafnium, aluminum, tantalum, titanium, yttrium, and lanthanoid.

A material selected from the group including of a hafnium oxide ($HfO_2$), a zircon oxide ($ZrO_2$), an aluminum oxide ($Al_2O_3$), a titanium oxide ($TiO_2$), and a tantalum oxide ($Ta_2O_5$), for example, is given as the material for the insulating film described above. Since the film made of any of those oxides has been used in a gate insulating film or the like of an insulated gate field-effect transistor, the film depositing method thereof is established, and thus that film can be readily deposited.

When $HfO_2$ (refractive index: 2.05), $Ta_2O_5$ (refractive index: 2.16), $TiO_2$ (refractive index: 2.20) or the like, having a relatively high refractive index, of those materials is especially used, it is also possible to obtain an antireflection effect.

With regard to insulating materials other than those materials described above, for example, oxides of rare earth elements are given. That is to say, there are given oxides of lanthanum, praseodymium, cerium, neodymium, promethium, samarium, europium, gadolinium, terbium, dysprosium, holmium, erbium, thulium, ytterbium, lutetium, and yttrium.

In addition, it is also possible to use any of a hafnium nitride, an aluminum nitride, a hafnium oxynitride, and an aluminum oxynitride.

Also, different materials are selected for the first film having the negative fixed charges and the second film having the negative fixed charges from the materials described above, respectively.

Silicon (Si) or nitrogen (N) may be added to the first film having the negative fixed charges or the second film having the negative fixed charges unless an insulating property is impaired. A concentration of silicon or nitrogen added is suitably determined so as not to impair the insulating property of the film. Silicon or nitrogen is added to the film in such a manner, thereby making it possible to enhance a heat resistance property of the film, and to enhance a capability of blocking ion implantation during the process.

More preferably, the first film having the negative fixed charges is deposited by using a film deposition method having a relative low film deposition rate. Furthermore preferably, for example, the first film having the negative fixed charges is formed at the film deposition rate of 0.01 to 1 nm/minute.

The film described above is formed by utilizing such a method as for example, the atomic layer deposition (ALD) method or the metal organic chemical vapor deposition (MOCVD) method.

When the first film is deposited by utilizing the ALD method, the deposition condition, for example, is set in such a way that a substrate temperature is in the range of 200 to 500° C., a flow rate of a precursor is in the range of 10 to 500 sccm, a radiation time period for the precursor is in the range of 1 to 15 seconds, and a flow rate of $O_3$ is in the range of 5 to 50 sccm.

When the first film is deposited by utilizing the MOCVD method, the deposition condition, for example, is set in such a way that the substrate temperature is in the range of 200 to 600° C.

It is noted that when the semiconductor layer is a silicon layer, and the first film is deposited on the semiconductor layer by using the ALD method, at the same time, a silicon oxide film for reducing the interface states can be formed on a surface of the silicon layer so as to have a thickness of about 1 nm.

More preferably, the second film having the negative fixed charges is deposited by using a film deposition method having a relatively higher film deposition rate than that of the film deposition method for the first film having the negative fixed charges. Furthermore preferably, for example, the second film having the negative fixed charges is formed at the film deposition rate of 10 to 50 nm/minute. A physical vapor deposition (PVD) method, for example, can be given as the film deposition method having such a film deposition rate.

When the second film is deposited by utilizing the PVD method, the deposition condition, for example, is set in such a way that a pressure is in the range of 0.01 to 50 Pa, a power is in the range of 500 to 2,000 W, a flow rate of Ar is in the range of 5 to 50 sccm, and a flow rate of $O_2$ is in the range of 5 to 50 sccm.

Since the second film is deposited by using the PVD method, the film deposition rate becomes higher than that of each of the ALD method and the MOCVD method. Thus, the film having a certain measure of thickness can be formed for a relatively short time.

Although a thickness of the first film having the negative fixed charges is especially by no means limited, a certain measure or more of thickness is required for the first film so as not to damage the semiconductor layer when the second film is formed. Preferably, the thickness of the first film is set as being equal to or larger than 1 nm.

In addition, when the first film is formed by using the film deposition method, such as the ALD method or the MOCVD method, having the relatively low film deposition method, it takes time to thicken the first film. For this reason, preferably, the thickness of the first film is set as being equal to or smaller than 20 nm.

A total thickness of the first film having the negative fixed charges and the second film having the negative fixed charges is preferably set in the range of 40 to 100 nm. More preferably, the total thickness thereof is set in the range of 50 to 70 nm from a viewpoint of antireflection.

Since in the present invention, the second film having the negative fixed charges is formed on the first film having the negative fixed charges, the sufficient negative bias effect is obtained by combining the first film and the second film with each other.

In addition, when the first film having the negative fixed charges is formed by using the film deposition method having the relatively low film deposition rate like an atomic layer deposition (ALD) method or a metal organic chemical vapor deposition (MOCVD) method, the semiconductor layer can be prevented from being damaged when the first film is formed.

In addition, since the first film having the negative fixed charges has the negative fixed charges, the semiconductor layer can be prevented from being damaged when the second film having the negative fixed charges is formed.

Also, since the second film is made of the material different from that of the first film, the restriction to the material for the film having the negative fixed charges is relaxed. As a result, it is possible to increase the degree of freedom of the design of the solid-state image pickup element.

Also, for example, $HfO_2$, $Ta_2O_5$ or $TiO_2$ having a relative highly refractive index is used as the second film having the negative fixed charges, whereby in addition to the antireflection effect described above, a light made incident to a photodiode is increased, thereby making it possible to enhance the sensitivity.

Therefore, according to the present invention, it is possible to suppress the generation of the dark current caused by the interface states in accordance with the effect of the negative bias having the sufficient magnitude. Therefore, it is possible to realize the solid-state image pickup element which has the high reliability, and which operates stably without generating the dark current. In addition, the restriction of the material for the film having the negative fixed charges is relaxed. Thus, the restriction of the characteristics of the film having the negative fixed charges is also relaxed. As a result, it is possible to increase the degree of freedom of the design of the solid-state image pickup element.

Also, the image pickup apparatus of the present invention is configured so as to include the solid-state image pickup element of the present invention. As a result, since the generation of the dark current can be suppressed in the solid-state image pickup element, the signal obtained through the photoelectric conversion in the solid-state image pickup element is stabilized. Therefore, it is possible to realize the highly reliable image pickup apparatus which stably operates and in which the satisfactory image quality is obtained.

<2. Solid-State Image Pickup Element>

FIG. 1 is a schematic cross sectional view showing a structure of a solid-state image pickup element according to an embodiment of the present invention.

The embodiment of the present invention corresponds to the case the present invention is applied to a so-called back surface radiation type CMOS solid-state image pickup element (CMOS image sensor).

In the CMOS solid-state image pickup element 1, in a silicon substrate 2 in a photodiode portion 41, a charge accumulation region 4 becoming a photodiode is composed, as a light receiving portion for photoelectrically converting an incident light, of an N-type impurity region.

A positive charge accumulation region 5 is formed on each of surfaces of the charge accumulation regions 4 of the respective photodiodes.

Also, the charge accumulation region 4 and the positive charge accumulation region 5 compose the HAD structure previously stated.

In the photodiode portion 41, gate electrodes 11 of MOS transistors Tr1 are formed below the respective charge accumulation regions 4 of the silicon substrate 2, and wiring layers 12 made from metallic wirings are formed further below the respective charge accumulation region 4 of the silicon substrate 2. FIG. 1 shows the wiring layers 12 of three layers. An interface insulating layer 13 insulates between the gate electrode 11 and the uppermost wiring layer 12, between the uppermost wiring layer 12 and the middle wiring layer 12, and between the middle wiring layer 12 and the lowermost wiring layer 12.

It is noted the insulating layer 13 is supported by a supporting substrate (not shown) provided downward.

Pixels are respectively composed of the photodiodes having the respective charge accumulation regions 4.

Each of the pixels is structured so as to have one or more transistors including a transistor (a transfer transistor for reading out and transferring the charges accumulated in the corresponding one of the charge accumulation regions 4 in this case) Tr1.

Each adjacent two charge accumulation regions 4 of the pixels are isolated by a P-type isolation region 3.

It should be noted that although not illustrated, preferably, a $p^+$-type semiconductor region is formed in an interface, of the charge accumulation region 4, on the side of the gate electrode 11 of the transistor Tr1, thereby suppressing generation of a dark current in the interface between the charge accumulation region 4 and the insulating layer 13.

MOS transistors Tr2 and Tr3 each composed of either an N-channel MOS transistor or a P-channel MOS transistor are formed in a peripheral circuit portion 42.

Source and drain regions (not shown) of the MOS transistors Tr2 and Tr3, and a semiconductor well region (not shown) becoming channels of the MOS transistors Tr2 and Tr3 are formed in the silicon substrate 2.

A film 23 having negative fixed charges is formed in an upper layer relative to the silicon substrate 2 having the photodiodes formed therein.

An electric field is applied to the surface of the charge accumulation region 4 owing to the presence of the negative fixed charges contained in the film 23 having the negative fixed charges, thereby forming a positive charge accumulation region (hole accumulation region) 5 in the surface of the charge accumulation region 4. As a result, the positive charge accumulation region 5 can be formed even when no ion is implanted into the surface of the charge accumulation region 4.

An insulating film 6, for example, made from a $SiO_2$ film is formed on the film 23 having the negative fixed charges contained therein.

A light blocking film 7 is formed on the insulating film 6 so as to cover a part of the photodiode portion 41, and the peripheral circuit portion 42.

A region in which a light is made incident to none of the photodiodes (optical block region (not shown)) is formed by the light blocking film 7, thereby making it possible to determine a black level in an image in accordance with outputs from the respective photodiodes.

In the peripheral circuit portion 42, a fluctuation of the characteristics of the MOS transistors Tr2 and Tr3, and the like caused by incidence of the light can be suppressed by the light blocking film 7.

A planarizing film 8 is formed so as to cover each of the $SiO_2$ film 6 and the light blocking film 7.

Color filters 9 having respective colors (red(R), green(G) and blue(B)) are formed every pixel on the planarizing film 8.

On-chip lenses 10 for light-condensing are provided on the color filters 9, respectively.

By adopting such a structure, with the CMOS solid-state image pickup element 1 of the embodiment, a light is made incident from an upper side of FIG. 1 to cause photoelectric conversion in each of the charge accumulation regions 4 of the respective photodiodes, thereby making it possible to receive and detect the incident light.

Also, the CMOS solid-state image pickup element 1 has a so-called back surface radiation type structure because the light is made incident to an upper layer on the side (back surface side) opposite to the side (front surface side) of the wiring layers 12 lying in the lower layer when viewed from the silicon substrate 2 having the photodiodes formed therein.

In the solid-state image pickup element 1 of this embodiment, in particular, the film 23 having the negative fixed charges has a two-layer lamination structure of the first film 21 having the negative fixed charges and composing a lower layer, and the second film 22 having the negative fixed charges and composing an upper layer.

The first film 21 and the second film 22 are made of the materials different from each other.

In addition, more preferably, the first film 21 composing the lower layer is deposited by using the film deposition method, such as the ALD method or the MOCVD method, having the relatively low film deposition rate, and the second film 22 composing the upper layer is deposited by using the film deposition method, such as the PVD method, having the relatively higher film deposition rate than that for the first film 21.

The materials of the first film 21 having the negative fixed charges and the second film 22 having the negative fixed charges can be formed from insulating films containing therein at least one element of silicon, hafnium, aluminum, tantalum, titanium, yttrium, and lanthanoid. Also, for example, it is also possible to use the oxide selected from $HfO_2$, $ZrO_2$, $Al_2O_3$, $TiO_2$, and $Ta_2O_5$. In addition, it is possible to use the nitride, the oxynitride, the oxide of the rate earth element or the like described above.

The different materials are selected for the first film 21 and the second film 22 from such materials, respectively.

Figure 14A:
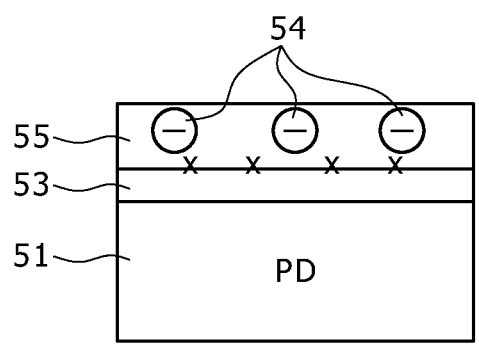
FIGS. 14A and 14B are respectively a schematic cross sectional view and an energy diagram each explaining the case where an insulating layer having negative fixed charges is formed on the silicon layer having a photodiode formed therein.
Figure 14B:
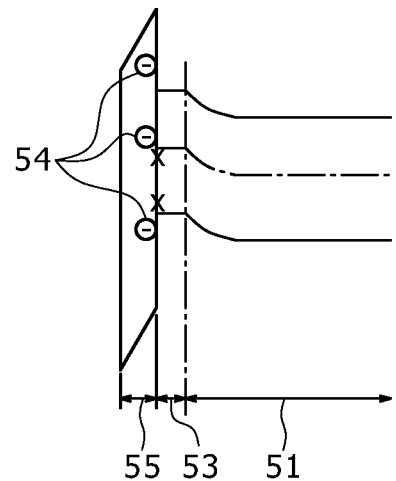

The provision of the film 23 (films 21, 22) having the negative fixed charges contained therein in the upper layer relative to the silicon substrate 2 results in that the band is bent similarly to the case of the related art shown in FIGS. 14A and 14B, thereby making it possible to accumulate the positive charges (holes) in the neighborhood of the interface of the silicon substrate 2.

It is noted that when $HfO_2$, $Ta_2O_5$, $TiO_2$ or the like, having a relatively high refractive index is especially formed as the films 21, 22 having the negative fixed charges contained therein, it is also possible to obtain an antireflection effect.

Next, a method of manufacturing the CMOS solid-state image pickup element 1 according to another embodiment of the present invention will be described in the following.

Figure 2:
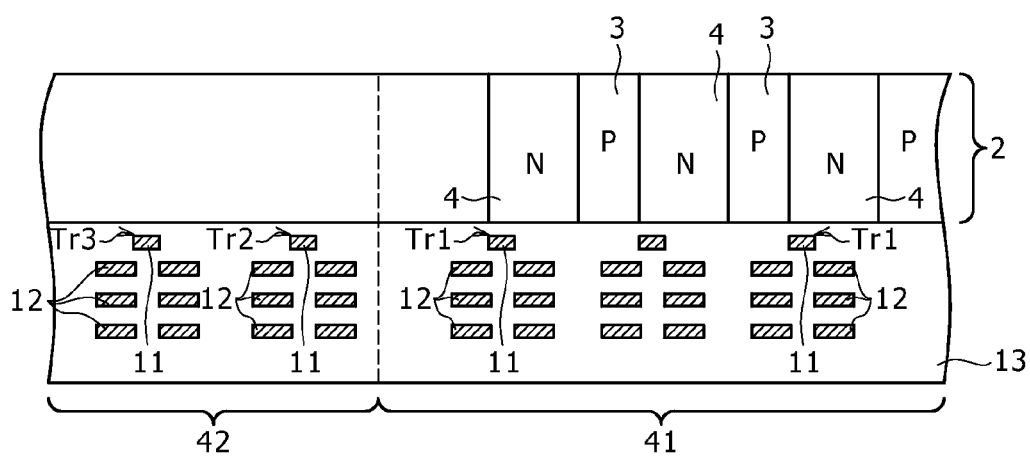
FIG. 2 is a schematic cross sectional view showing a process in a method of manufacturing the solid-state image pickup element shown in FIG. 1.

The description will now be started with a state in which as shown in FIG. 2, the charge accumulation regions 4 are formed in the silicon substrate 2 in the photodiode portion 41, and the gate electrodes 11 of the respective MOS transistors Tr1, Tr2 and Tr3, and the wiring layers 12 are formed in the photodiode portion 41 and in the peripheral circuit portion 42.

Figure 3:
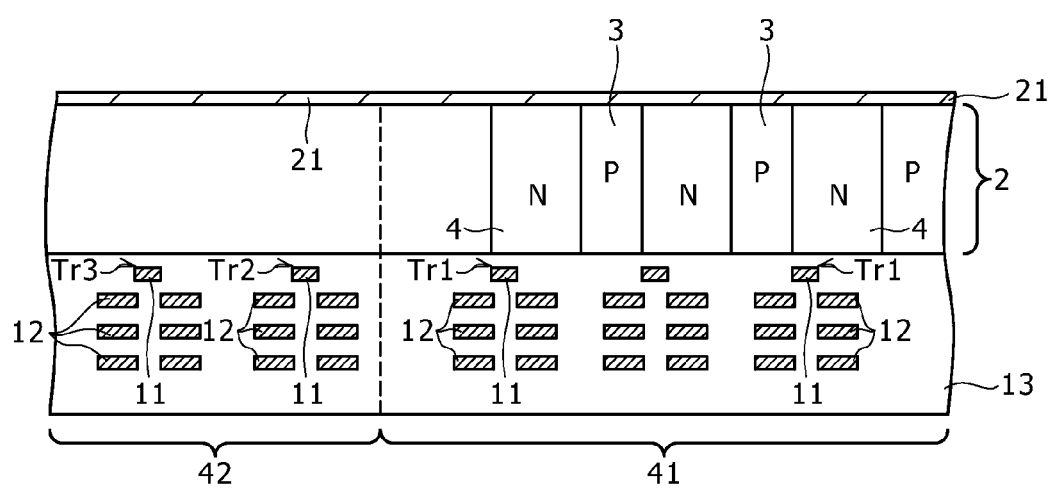
FIG. 3 is a schematic cross sectional view showing a process in a method of manufacturing the solid-state image pickup element shown in FIG. 1.

Firstly, as shown in FIG. 3, the first film 21 having the negative fixed charges is formed by using the film deposition method having the relatively low film deposition rate like an ALD method or a MOCVD method. An insulating material containing therein at least one element of silicon, hafnium, aluminum, tantalum, titanium, yttrium, and lanthanoid is used as a material of the first film 21 having the negative fixed charges. Specifically, $HfO_2$, $ZrO_2$, $Al_2O_3$, $TiO_2$, and $Ta_2O_5$, for example, is given as the material for the film 21.

The deposition condition by utilizing the ALD method, for example, is set in such a way that the substrate temperature for the film deposition is in the range of 200 to 500° C., the flow rate of the precursor is in the range of 10 to 500 sccm, the radiation time period for the precursor is in the range of 1 to 15 seconds, and the flow rate of $O_3$ is in the range of 10 to 500 sccm.

A thickness of the first film 21 is preferably made equal to or larger than 1 nm and equal to or smaller than 20 nm.

It is noted that when the first film 21 is deposited by using the ALD method, at the same time, a silicon oxide film (having a thickness of about 1 nm) is formed on a surface of the silicon substrate 2 in some cases.

Figure 4:
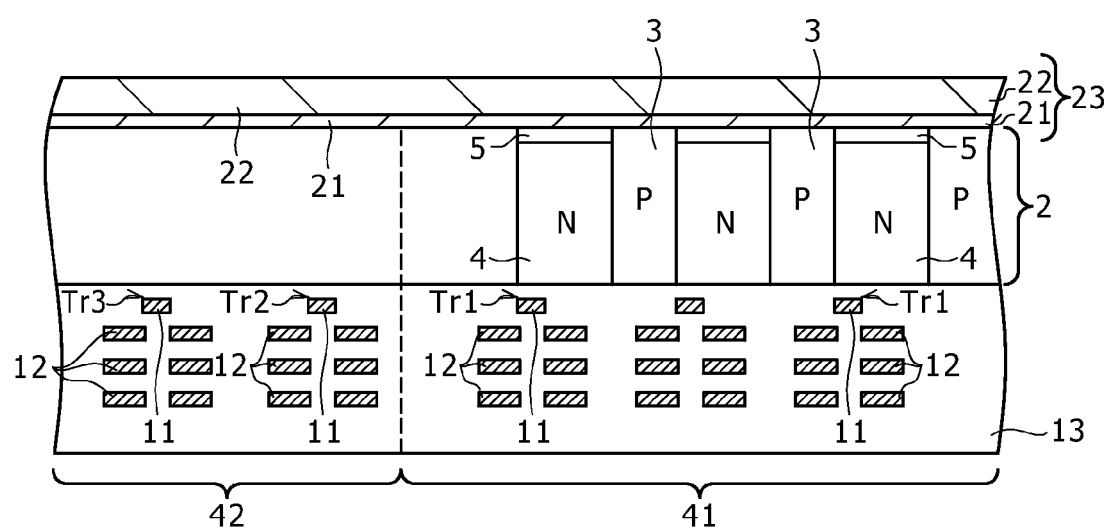
FIG. 4 is a schematic cross sectional view showing a process in a method of manufacturing the solid-state image pickup element shown in FIG. 1.

Next, as shown in FIG. 4, the second film 22 having the negative fixed charges is formed on the first film 21 having the negative fixed charges by using the film deposition method, such as the PVD method, having the relatively higher film deposition rate than that for the first film 21. An insulating material containing therein at least one element of silicon, hafnium, aluminum, tantalum, titanium, yttrium, and lanthanoid is used as a material of the second film 22 having the negative fixed charges different from that of the first film 21. Specifically, $HfO_2$, $ZrO_2$, $Al_2O_3$, $TiO_2$, and $Ta_2O_5$, for example, is given as the material for the film 22.

Also, when the film 22 having the negative fixed charges contained therein is deposited by utilizing the PVD method, the deposition condition, for example, is set in such a way that the pressure is in the range of 0.01 to 50 Pa, the D.C. power is in the range of 500 to 2,000 W, the flow rate of Ar is in the range of 5 to 50 sccm, and the flow rate of $O_2$ is in the range of 5 to 50 sccm.

The second film 22 having the negative fixed charges contained therein is formed on the first film 21 having the negative fixed charges contained therein, thereby forming the film 23 having the negative fixed charges contained therein laminated these two layers 21, 22. By the film 23 having the negative fixed charges, the positive charge accumulation region 5 is formed on each of the surfaces of the charge accumulation regions 4.

Figure 5:
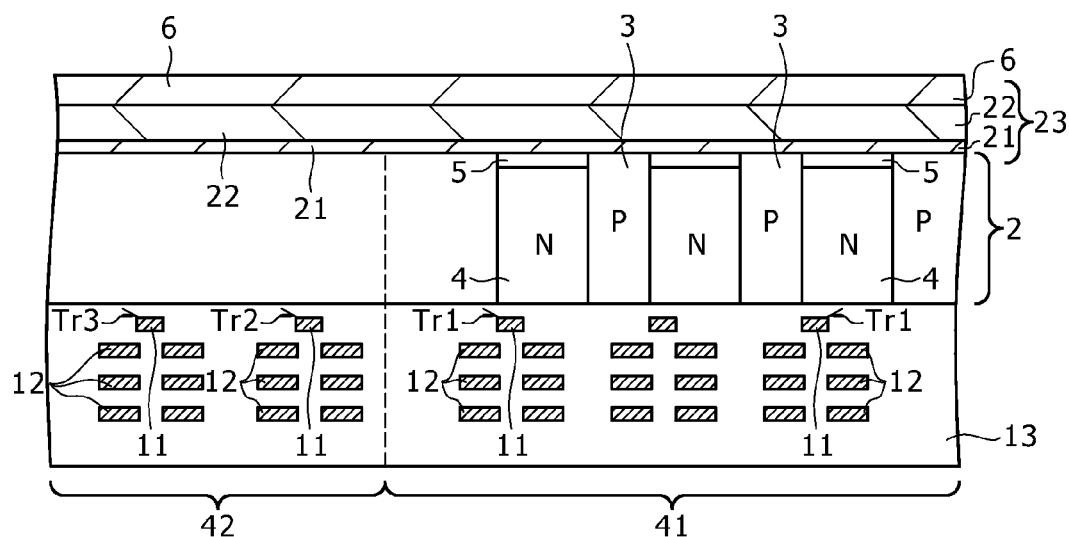
FIG. 5 is a schematic cross sectional view showing a process in a method of manufacturing the solid-state image pickup element shown in FIG. 1.

Next, as shown in FIG. 5, the insulating film 6 made from the $SiO_2$ film or the like is formed on the second film 22 having the negative fixed charges contained therein.

Formation of the insulating film 6 results in that the surface of the second film 22 having the negative fixed charges contained therein can be prevented from being directly exposed to the etching in the later etching for the light blocking film 7. In addition, it is possible to suppress a reaction between the second film 22 having the negative fixed charges contained therein and the light blocking film 7 resulting from that the second film 22 having the negative fixed charges contained therein and the light blocking film 7 are made to directly contact each other.

Figure 6:
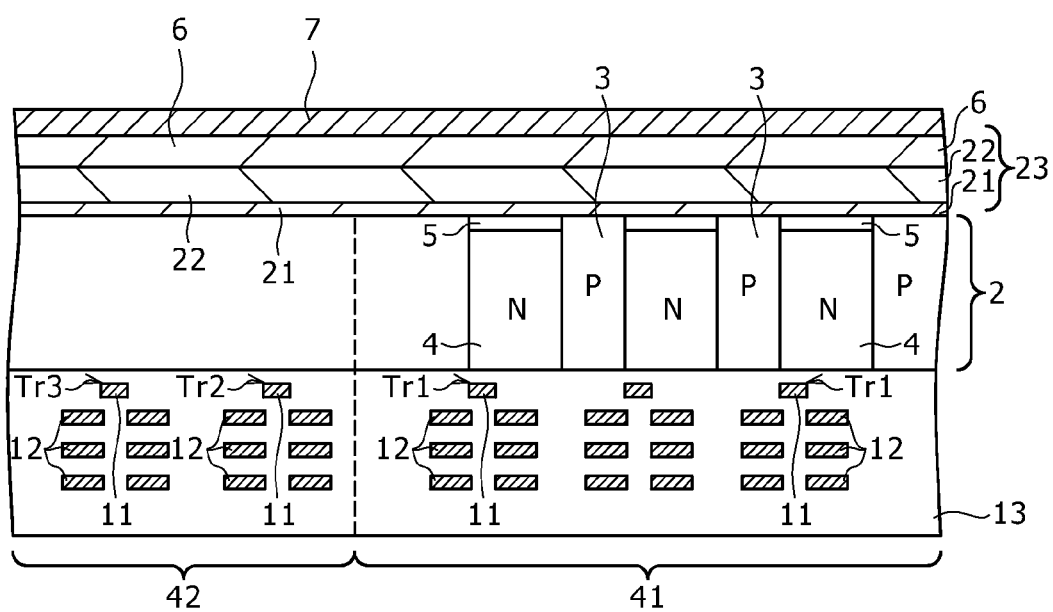
FIG. 6 is a schematic cross sectional view showing a process in a method of manufacturing the solid-state image pickup element shown in FIG. 1.

Next, as shown in FIG. 6, the metallic film becoming the light blocking film 7 is formed on the insulating film 6.

Figure 7:
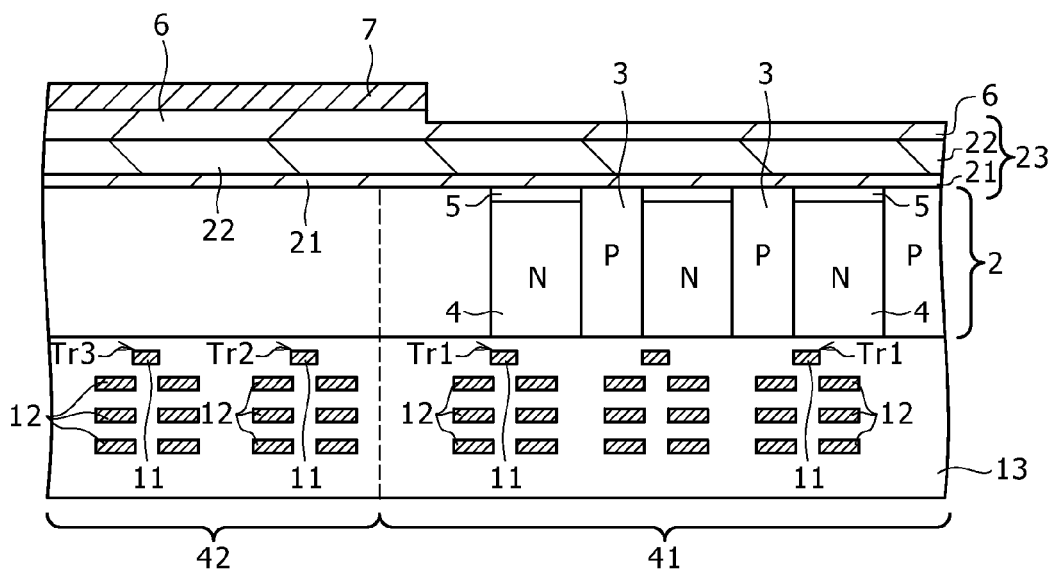
FIG. 7 is a schematic cross sectional view showing a process in a method of manufacturing the solid-state image pickup element shown in FIG. 1.

In addition, as shown in FIG. 7, the upper portions of the light blocking film 7 and the insulating film 6 are processed by carrying out the etching. As a result, the light blocking film 7 is left on the part of the photodiode portion 41, and the peripheral circuit portion 42.

Figure 8:
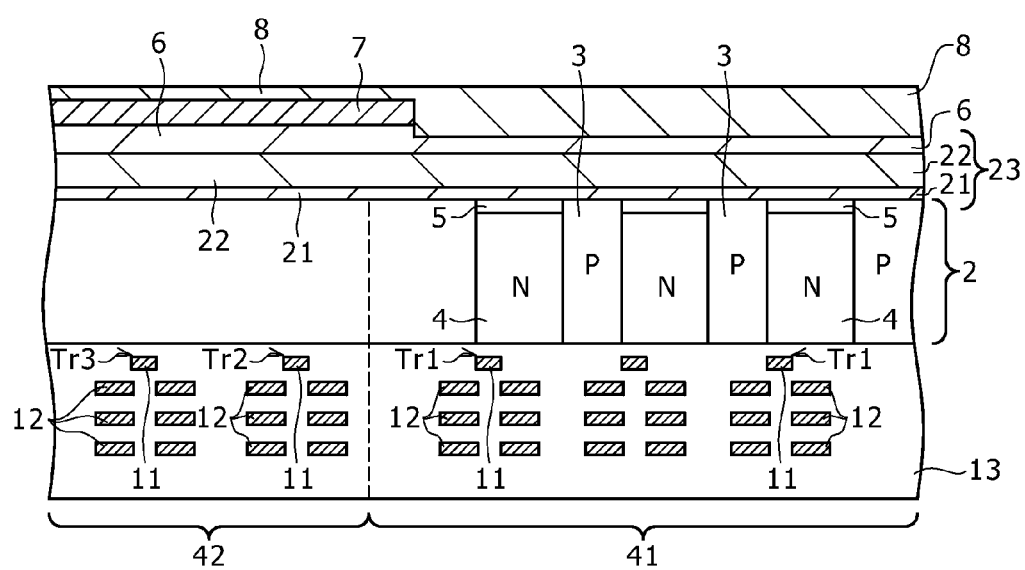
FIG. 8 is a schematic cross sectional view showing a process in a method of manufacturing the solid-state image pickup element shown in FIG. 1.

Next, as shown in FIG. 8, the planarizing film 8 is formed so as to cover the surface of the part of the photodiode portion 41, and the surface of the remaining light blocking film 7. The $SiO_2$ film, for example, is formed as the planarizing film 8 by utilizing the application method. The planarizing film 8 is formed so as to have a sufficient thickness, whereby the surface can be planarized by removing a stepped portion formed between the insulating film 6 and the remaining light blocking film 7.

Figure 9:
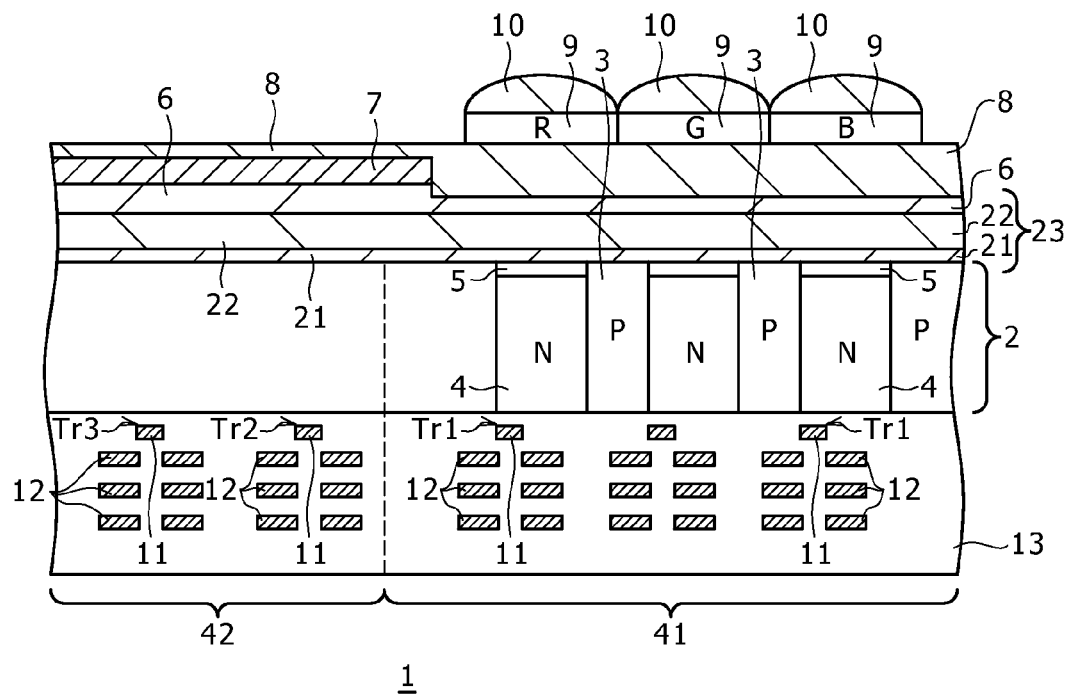
FIG. 9 is a schematic cross sectional view showing a process in a method of manufacturing the solid-state image pickup element shown in FIG. 1.

Finally, as shown in FIG. 9, in the photodiode portion 41, the color filters 9 and the on-chip lenses 10 are formed in this order above the photodiodes of the respective pixels.

It is noted that for the purpose of preventing the processing damage to the color filters 9 during the lens processing, a light transmissive insulating film (not shown) may be formed between the color filters 9 and the on-chip lenses 10.

In such a manner, the CMOS solid-state image pickup element 1 shown in FIG. 1 can be manufactured.

According to the structure of the CMOS solid-state image pickup element 1 shown in FIG. 1 of the embodiment, the first film 21 having the negative fixed charges contained therein is formed on the silicon substrate 2, having the charge accumulation regions 4 formed therein, in the photodiode portion 41. The second film 22 having the negative fixed charges contained therein is formed on the first film 21 having the negative fixed charges contained therein, thereby forming the film 23 having the negative fixed charges contained therein laminated these two layers 21, 22.

The sufficient negative bias effect is obtained in combination of the two films of the first film 21 and the film 22 each having the negative fixed charges contained therein. Thus, the band can be bent similarly to the case of the related art shown in FIGS. 14A and 14B owing to the presence of the negative fixed charges contained in the first film 21 and the film 22 each having the negative fixed charges. As a result, each of the positive charge accumulation regions 5 is formed in the neighborhood of the interface of the silicon substrate 2 so that the positive charges (holes) are accumulated in each of the positive charge accumulation regions 5, thereby making it possible to suppress the generation of the dark current caused by the interface states.

When the first film 21 having the negative fixed charges is formed by using the film deposition method having the relatively low film deposition rate such as an ALD method or a MOCVD method, the silicon substrate 2 can be prevented from being damaged when the first film 21 is formed.

In addition, since the first film 21 is formed as the base of the second film 22 having the negative fixed charges, the first film 21 can prevent the silicon substrate 2 from being damaged in forming the second film 22 having the negative fixed charges.

The first film 21 having the negative fixed charges is made of a material different from that of the second film 22 having the negative fixed charges.

As a result, unlike the case of the related art described in Patent Document 2, the same materials do not have to be laminated by utilizing the different two film deposing method, and thus the restriction of the material for the film 23 (films 21, 22) is relaxed.

Therefore, according to the embodiment of the present invention, it is possible to suppress the generation of the dark current caused by the interface states in accordance with the effect of the negative bias having the sufficient magnitude. Therefore, it is possible to realize the solid-state image pickup element 1 which has the high reliability, and which operates stably without generating the dark current.

In addition, the restriction of the film 23 (films 21, 22) having the negative fixed charges contained therein is relaxed. Thus, the restriction of the characteristics of the film 23 (films 21, 22) having the negative fixed charges is also relaxed. As a result, it is possible to increase the degree of freedom of the design of the solid-state image pickup element.

It should be noted that a charge accumulation region 4 composing the photodiode can also be formed in a silicon epitaxial layer on a silicon substrate instead of forming the charge accumulation region 4 composing the photodiode in the silicon substrate 2 shown in FIG. 1.

In addition, it should be noted that the structure of the upper layers relative to the second film 22 having the negative fixed charges contained therein, and the structure of the peripheral circuit portion 42 are by no means limited to those in the embodiment described above, and thus various changes thereof can be made.

For example, it is also possible to adopt the structure described as an embodiment in Patent Document 2.

Although the embodiment described above corresponds to the case where the present invention is applied to the CMOS solid-state image pickup element, the present invention can also be applied to a solid-state image pickup element having any other suitable structure.

For example, the present invention can also be applied to a CCD solid-state image pickup element. In this case, a silicon oxide film formed by using the plasma, and a film having negative fixed charges are formed in order on a light receiving portion, thereby making it possible to suppress the generation of the dark current caused by the interface states.

In addition, the embodiment described above corresponds to the case where the present invention is applied to the CMOS solid-state image pickup element having the back surface radiation type structure.

However, the present invention can also be applied to a solid-state image pickup element having a so-called surface radiation type structure in which wiring layers and transfer electrodes are formed on a side, of a semiconductor layer having photodiodes formed therein, to which a light is made incident.

<3. Experiments (Measurements about Characteristics)>

Here, similarly to the case of the solid-state image pick-up element 1 shown in FIG. 1, the first film having the negative fixed charges was formed by using the ALD method, and the second film having the negative fixed charges was formed on the first film having the negative fixed charges by using the PVD method, and the characteristics of the resulting lamination structure were examined.

(Experiment 1)

To begin with, MOS capacitors in each of which an electrode layer was formed on a silicon substrate through an insulating layer were manufactured as test element groups (TEGs).

Also, the TEGs using the following lamination structures were manufactured as the insulating layers of the MOS capacitors.

(1) The $HfO_2$ film was formed so as to have a thickness of 10 nm by using the ALD method, and the $HfO_2$ film was formed so as to have a thickness of 50 nm by utilizing the PVD method.

(2) The $HfO_2$ film was formed so as to have a thickness of 10 nm by using the ALD method, and the $Ta_2O_5$ film was formed on the $HfO_2$ film so as to have a thickness of 50 nm by utilizing the PVD method.

A measurement of general C-V characteristics (Qs-CV: Quasi-static-CV) using D.C., and a measurement of C-V characteristics (Hf-CV: High-frequency-CV) using a high frequency were carried out for each of the TEGs manufactured. Qs-CV is a measurement method of sweeping a gate voltage in the form of a linear function of time, thereby obtaining a displacement current caused to flow between a gate and a substrate.

A capacitance C in a low-frequency region was obtained from the measurement of the Qs-CV characteristics.

In addition, an interface state density Dit was obtained from a difference between a measured value about Qs-CV and a measured value about Hf-CV.

Figure 10A:
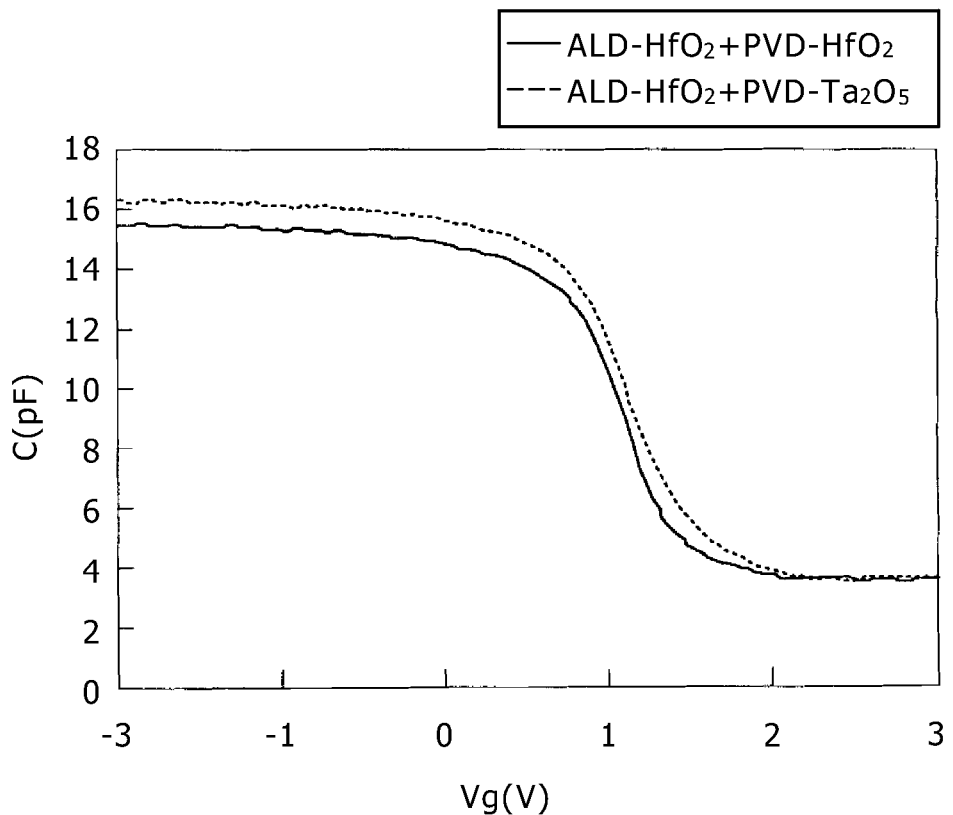
FIG. 10A is a graph showing a relationship between a gate voltage and a capacitance obtained through a C-V measurement about a test element group (TEG)
Figure 10B:
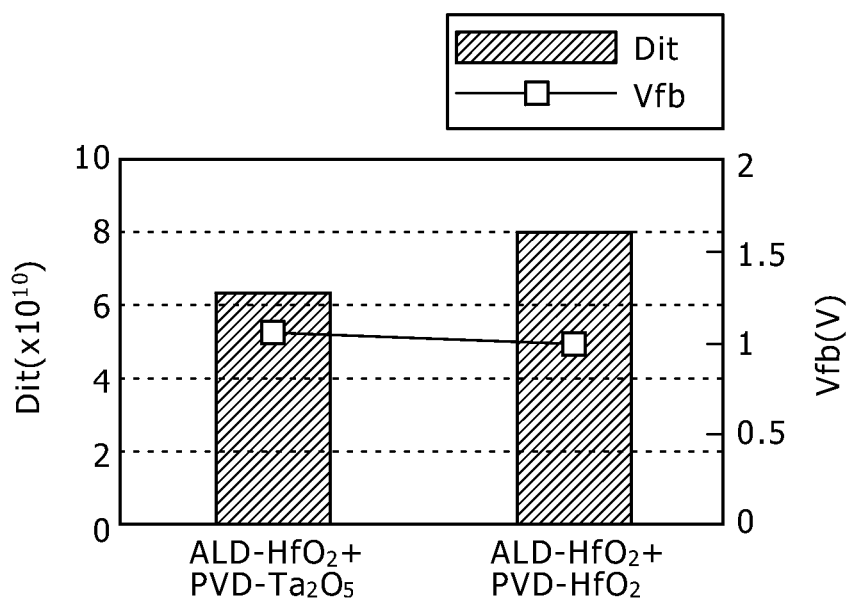
FIG. 10B is a graph showing flat band voltages and an amount of interface states in specimens.

A relationship between a voltage Vg(V) and a capacitance C(pF) is shown as a measurement result in FIG. 10A. In addition, the interface state density Dit, and a magnitude of a flat band voltage Vfb(V) in FIG. 10A are shown in FIG. 10B.

It is understood from FIG. 10A that when the $HfO_2$ film is formed by using the ALD method and the $Ta_2O_5$ film is formed on the $HfO_2$ film by using the PVD method, a similar flat band voltage is obtained and the interface state density becomes slightly small as compared with the case of the $HfO_2$ film formed by combining the ALD method and the PVD method with each other.

(Experiment 2)

A structure simulating the structure of the actual solid-state image pickup element 1 was designed, and a calculation was carried out based on the simulation, whereby a relationship between a wavelength of an incident light, and a magnitude of a sensitivity to the wavelength was examined.

The structure designed is a silicon substrate (thickness: 3 μm)/a $SiO_2$ film (thickness: 1 nm)/a $HfO_2$ film formed by the ALD method (thickness: 10 nm)/an oxide film formed by the PVD method/a silicon oxide film formed by the plasma CVD method (thickness: 150 nm)/a planarizing film (thickness: 100 nm).

Two kinds of oxide films, i.e., the $Ta_2O_5$ film and the $HfO_2$ film were prepared as the oxide films each formed by the PVD method.

Also, the simulation was carried out while the thicknesses of the respective oxide films were changed, thereby obtaining the thicknesses each having the highest sensitivity. As a result, the sensitivities become highest when the thickness of the $Ta_2O_5$ film was 40 nm, and the thickness of the $HfO_2$ film was 50 nm.

Figure 11:
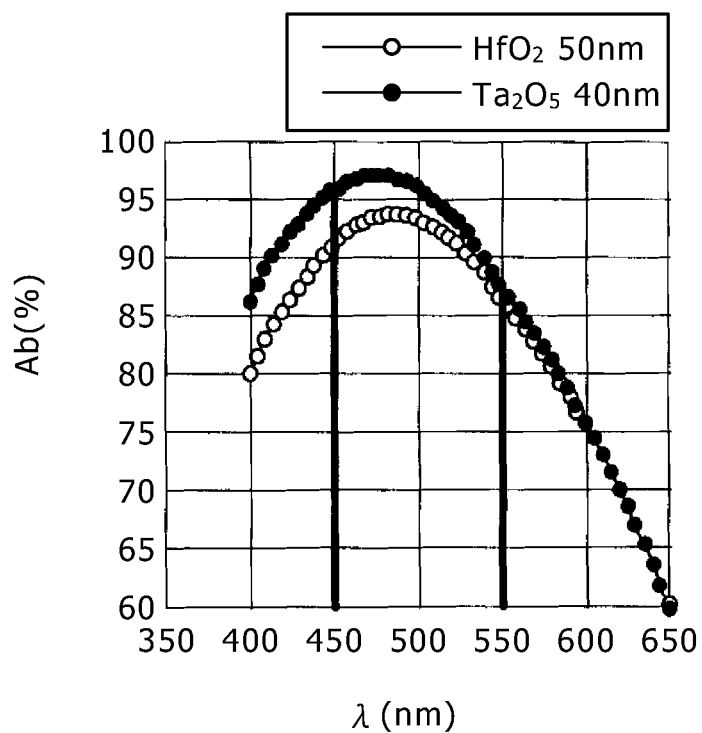
FIG. 11 is a graph showing changes of an absorption factor depending on a wavelength in the specimens.
Figure 12A:
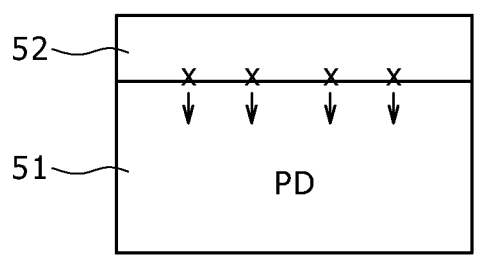
FIGS. 12A and 12B are respectively a schematic cross sectional view and an energy diagram each explaining the case where an insulating layer is formed on a silicon layer having a photodiode formed therein.
Figure 12B:
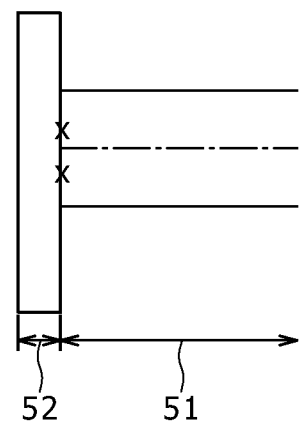
Figure 13A:
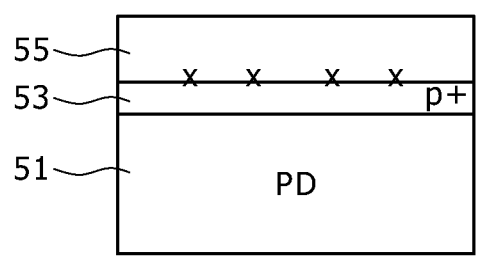
FIGS. 13A and 13B are respectively a schematic cross sectional view and an energy diagram each explaining the case where a p$^+$-type semiconductor region is formed to obtain an HAD structure.
Figure 13B:
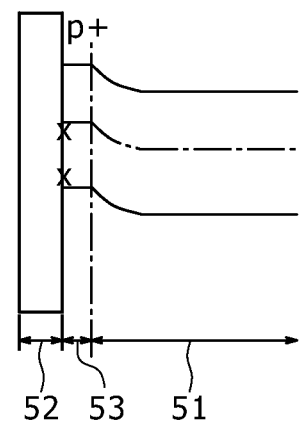

Next, FIG. 11 shows a change of an absorption factor Ab depending on a wavelength λ of a light in the thicknesses giving the respective films the highest sensitivities.

It is understood from FIG. 11 that making a comparison in the wavelength range of 450 to 550 nm, the absorption factor becomes high when the $Ta_2O_5$ film is used, and the absorption factor of the $Ta_2O_5$ film becomes about 10% larger than that of the $HfO_2$ film in the vicinity of 450 nm.

That is to say, it is understood that when the $Ta_2O_5$ film having the relatively large refractive index is used as the second film having the negative fixed charges, the absorption factor in that wavelength range is largely increased and thus the sensitivity in that wavelength range is enhanced.

<4. Image Pickup Apparatus>

Next, an image pickup apparatus according to still another embodiment of the present invention will be described in detail with reference to FIG. 15.

Figure 15:
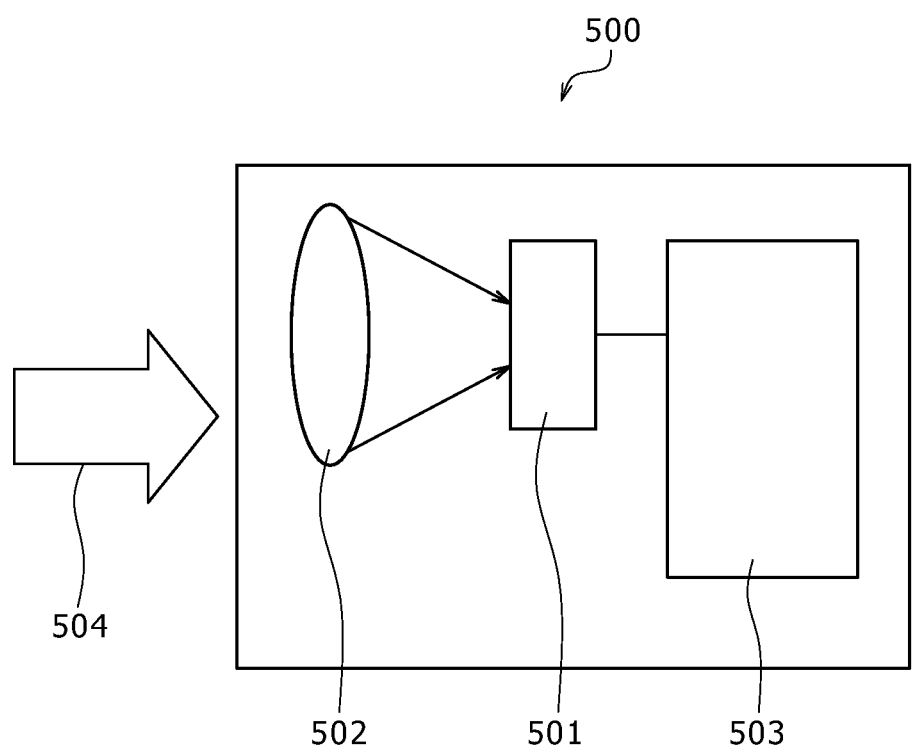
FIG. 15 is a schematic block diagram showing a configuration of an image pickup apparatus according to another embodiment of the present invention.

FIG. 15 is a schematic block diagram showing a configuration of the image pickup apparatus according to the still another embodiment of the present invention.

A video camera, a digital still camera, a camera of a mobile phone, or the like, for example, is given as the image pickup apparatus of the still another embodiment.

As shown in FIG. 15, the image pickup apparatus 500 has an image pickup portion 501 including a solid-state image pickup element (not shown). An imaging optical system 502 for condensing an incident light to image an image corresponding to the incident light 504 is provided in a preceding stage of the image pickup portion 501. In addition, a signal processing portion 503 having a drive circuit for driving the image pickup portion 501, a signal processing circuit for processing a signal obtained through photoelectric conversion in the image pickup element into an image, and the like is connected to a subsequent stage of the image pickup portion 501. In addition, the image signal obtained through the processing executed in the signal processing portion 503 can be stored in an image storage portion (not shown).

In the image pickup apparatus 500 of the still another embodiment of the present invention, the CMOS solid-state image pickup element 1 of the embodiment previously described with reference to FIG. 1 is used as the solid-state image pickup element.

According to the image pickup apparatus 500 of the still another embodiment, there is an advantage that an image of high grade can be recorded because of use of the CMOS solid-state image pickup element in which the generation of the dark current is suppressed in accordance with the sufficient negative bias effect.

It should be noted that the image pickup apparatus of the present invention is by no means limited to the configuration shown in FIG. 15, and thus the present invention can be applied to the image pickup apparatus as long as the image pickup apparatus uses the image pickup element of the present invention.

For example, the image pickup element may have a form which is formed as one chip or may also have a module-like form which has an image pickup function, and into which the image pickup portion, and the signal processing portion or the optical system are collectively packaged.

The image pickup apparatus of the present invention, for example, can be applied to various kinds of image pickup apparatuses such as a camera and a mobile apparatus having an image pickup function. In addition, the wording "the image pickup apparatus" includes a fingerprint detecting apparatus or the like as well in the wide sense.

The present invention is by no means limited to the embodiments described above, and thus various constitutions may also be adopted without departing from the gist of the present invention.

The invention claimed is:

1. An imaging device, comprising:
   a semiconductor layer having a photodiode formed therein, photoelectric conversion being carried out in said photodiode;
   a first film, made of a material containing at least one element of silicon, hafnium, aluminum, tantalum, titanium, yttrium, and lanthanoid, and formed over said semiconductor layer in a region in which at least said photodiode is formed; and
   a second film, made of a material different from that of said first film, and formed on said first film,
   wherein said first film contains at least one of a hafnium oxide, a zircon oxide, an aluminum oxide, a titanium oxide, a tantalum oxide, a lanthanum oxide, a praseodymium oxide, a cerium oxide, a neodymium oxide, a promethium oxide, a samarium oxide, an europium oxide, a gadolinium oxide, a terbium oxide, a dysprosium oxide, a holmium oxide, an erbium oxide, a thulium oxide, an ytterbium oxide, a lutetium oxide, an yttrium oxide, a hafnium nitride, an aluminum nitride, a hafnium oxynitride, and an aluminum oxynitride.

2. The imaging device according to claim 1, wherein said second film contains at least one element of silicon, hafnium, aluminum, tantalum, titanium, yttrium, and lanthanoid.

3. The imaging device according to claim 2, wherein said second film having the negative fixed charges is formed by using a film deposition method having a higher film deposition rate than that for said first film having the negative fixed charges.

4. The imaging device according to claim 1, wherein said second film contains at least one of a hafnium oxide, a zircon oxide, an aluminum oxide, a titanium oxide, a tantalum oxide, a lanthanum oxide, a praseodymium oxide, a cerium oxide, a neodymium oxide, a promethium oxide, a samarium oxide, an europium oxide, a gadolinium oxide, a terbium oxide, a dysprosium oxide, a holmium oxide, an erbium oxide, a thulium oxide, an ytterbium oxide, a lutetium oxide, an yttrium oxide, a hafnium nitride, an aluminum nitride, a hafnium oxynitride, and an aluminum oxynitride.

5. The imaging device according to claim 1, further comprising:
   an insulating film formed on said second film.

6. The imaging device according to claim 5, wherein said insulating film is made of silicon oxide.

7. The imaging device according to claim 5, wherein said imaging device is formed as one chip.

8. The imaging device according to claim 5, further comprising:
   an image pickup portion including at least said semiconductor layer, said first film and said second film; and
   a signal processing portion configured to process a signal obtained through the photoelectric conversion into an image,
   wherein at least said image pickup portion and said signal processing portion are collectively packaged.

9. An image pickup apparatus, comprising:
   a condensing optical portion configured to condense an incident light;
   an imaging device including a first film, made of a material containing at least one element of silicon, hafnium, aluminum, tantalum, titanium, yttrium, and lanthanoid, and formed over a semiconductor layer in a region in which at least a photodiode is formed, a second film, made of a material different from that of said first film, and formed on said first film, the imaging device serving to receive the incident light condensed by the condensing optical portion, thereby carrying out photoelectric conversion for the incident light; and
   a signal processing portion configured to process a signal obtained through the photoelectric conversion in said imaging device,
   wherein said first film contains at least one of a hafnium oxide, a zircon oxide, an aluminum oxide, a titanium oxide, a tantalum oxide, a lanthanum oxide, a praseodymium oxide, a cerium oxide, a neodymium oxide, a promethium oxide, a samarium oxide, an europium oxide, a gadolinium oxide, a terbium oxide, a dysprosium oxide, a holmium oxide, an erbium oxide, a thulium oxide, an ytterbium oxide, a lutetium oxide, an yttrium oxide, a hafnium nitride, an aluminum nitride, a hafnium oxynitride, and an aluminum oxynitride.

10. The image pickup apparatus according to claim 9, wherein said second film contains at least one element of silicon, hafnium, aluminum, tantalum, titanium, yttrium, and lanthanoid.

11. The image pickup apparatus according to claim 10, wherein said second film having the negative fixed charges is formed by using a film deposition method having a higher film deposition rate than that for said first film having the negative fixed charges.

12. The image pickup apparatus according to claim 9, wherein said second film contains at least one of a hafnium oxide, a zircon oxide, an aluminum oxide, a titanium oxide, a tantalum oxide, a lanthanum oxide, a praseodymium oxide, a cerium oxide, a neodymium oxide, a promethium oxide, a samarium oxide, an europium oxide, a gadolinium oxide, a terbium oxide, a dysprosium oxide, a holmium oxide, an erbium oxide, a thulium oxide, an ytterbium oxide, a lutetium oxide, an yttrium oxide, a hafnium nitride, an aluminum nitride, a hafnium oxynitride, and an aluminum oxynitride.

13. The image pickup apparatus according to claim 9, further comprising:
   an insulating film formed on said second film.

14. The image pickup apparatus according to claim 13, wherein said insulating film is made of silicon oxide.

15. The image pickup apparatus according to claim 13, wherein said image pickup apparatus is at least one of a video camera, a digital still camera, a mobile phone and a fingerprint detecting apparatus.

* * * * *